United States Patent
Nirschl et al.

(10) Patent No.: US 8,130,558 B2
(45) Date of Patent: Mar. 6, 2012

(54) SYSTEM AND METHOD FOR LEVEL SHIFTER

(75) Inventors: Thomas Nirschl, München (DE); Jan Otterstedt, Unterhaching (DE); Michael Bollu, Kirchheim (DE); Wolf Allers, München (DE)

(73) Assignee: Infineon Technologies AG, Neubiberg (DE)

( * ) Notice: Subject to any disclaimer, the term of this patent is extended or adjusted under 35 U.S.C. 154(b) by 358 days.

(21) Appl. No.: 12/367,249

(22) Filed: Feb. 6, 2009

(65) Prior Publication Data

US 2010/0202218 A1    Aug. 12, 2010

(51) Int. Cl.
*G11C 7/00* (2006.01)
(52) U.S. Cl. ............... 365/189.02; 365/189.11; 365/218
(58) Field of Classification Search ............. 365/189.02, 365/189.11, 218, 189.01, 154, 156, 203, 365/129, 189.09, 189.18, 226
See application file for complete search history.

(56) References Cited

U.S. PATENT DOCUMENTS

| | | | |
|---|---|---|---|
| 6,366,492 B1 * | 4/2002 | Kawasumi | 365/154 |
| 6,519,725 B1 * | 2/2003 | Huisman et al. | 714/718 |
| 7,151,701 B2 * | 12/2006 | Combe et al. | 365/189.07 |
| 7,369,446 B2 | 5/2008 | Chan et al. | |
| 2009/0073745 A1 * | 3/2009 | Suzuki | 365/154 |

FOREIGN PATENT DOCUMENTS

DE    102006001420    7/2006

OTHER PUBLICATIONS

Deml, C., et al., "A 0.13 µm 2.125MB 23.5ns Embedded Flash with 2GB/s Read Throughput for Automotive Microcontrollers," IEEE International Solid-State Circuits Conference, Session 26, Non-Volatile Memories, 26.4, 2007, pp. 478-479 and 617.

* cited by examiner

*Primary Examiner* — Dang Nguyen
(74) *Attorney, Agent, or Firm* — Slater & Matsil, L.L.P.

(57) ABSTRACT

In one embodiment, a bit-line interface is disclosed. The bit-line interface has a multiplexer having a plurality of bit-line outputs, and a write path coupled to a multiplexer signal input. The bit-line interface also has a read path coupled to the multiplexer signal input, wherein the read path and the write path share at least one component.

18 Claims, 3 Drawing Sheets

SYSTEM AND METHOD FOR LEVEL SHIFTER

TECHNICAL FIELD

This invention relates generally to semiconductor circuits, and more particularly to a system and method for a level shifter.

BACKGROUND

As semiconductor feature sizes get smaller and smaller, the voltage level that low voltage, minimum geometry devices can withstand has decreased correspondingly. Because high voltage devices have to isolate the same voltage independent of the technology node, however, the area consumption of high-voltage devices compared to low voltage devices is steadily increasing. Thinner gate oxides and shorter channel lengths have reduced common supply voltages from the 5V and 3.3V seen a decade ago to 1.2V and below. The higher device density and faster performance of sub-micron processes have come at a cost of lower device breakdown voltages. High demand for small portable devices such as MP3 players have also increased the demand for circuits that can operate efficiently on a single battery cell.

Lower power supply voltages have posed a number of circuit design challenges and difficulties. One of these difficulties lies in the design of dense non-volatile memory. Very small feature sizes are required in order to economically fabricate and produce non-volatile memory devices having billions of memory cells on a single integrated circuit. Programming and erasing non-volatile memories, such as electrically erasable read only memory (EEPROM) and Flash memory, requires applying voltage levels higher than a typical minimum size sub-micron device can withstand. For example, write voltages of up to about 20V may be required in a process that only withstands a maximum voltage of about 2V. One solution to this problem has been to fabricate high voltage devices that can withstand the higher programming voltages and use these devices for memory array support circuitry, such as charge-pumps, level shifters and bit-line drivers, which must withstand these high voltages.

These high voltage devices come at a cost of thicker oxides and device areas that significantly exceed the device areas of minimum geometry low voltage devices. It is necessary to increase the physical dimensions of these high-voltage devices, as well as provide thicker gate oxides that will not break down or will not fail in the presence of these higher voltages. Incorporating these high voltage devices into high-density, non-volatile memories requires devoting a significant amount of silicon area to high voltage support circuitry, thereby limiting the maximum number of non-volatile memory cells that can be fabricated on a given integrated circuit.

In the field of non-volatile memories, what is needed are devices and methods of reducing the area devoted to high-voltage support circuitry.

SUMMARY OF THE INVENTION

In one embodiment, a bit-line interface is disclosed. The bit-line interface has a multiplexer having a plurality of bit-line outputs, and a write path coupled to a multiplexer signal input. The bit-line interface also has a read path coupled to the multiplexer signal input, wherein the read path and the write path share at least one component.

The foregoing has outlined, rather broadly, features of the present invention. Additional features of the invention will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present invention and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to embodiments in a specific context, namely a level shifter for a bit-line interface for a non-volatile memory. Embodiments of this invention may also be applied to other circuits and systems that require area efficient use of high-voltage support circuitry in high-density circuit applications.

Figure 1:
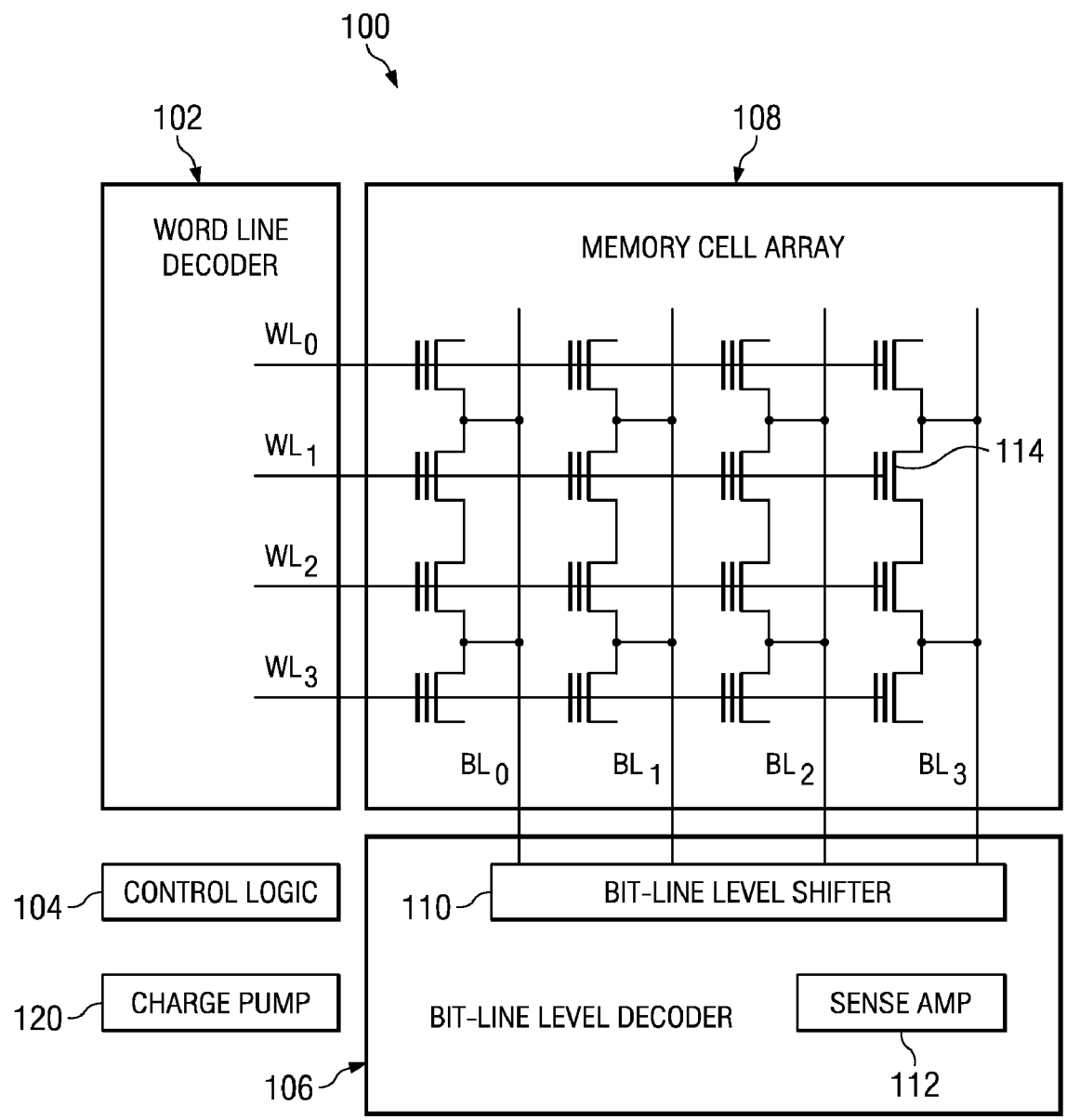
FIG. 1 illustrates an embodiment memory array and associated support circuitry.

A non-volatile memory system 100 according to an embodiment of the present invention is shown in FIG. 1. Non-volatile memory cell array 108 is interfaced to word-line decoder 102 and bit-line decoder 106. Generally, the non-volatile memory cell array 108 is made up of individual non-volatile memory cells 114, which are constructed in preferred embodiments as floating gate cells where charge is stored on a floating gate. In alternative embodiments, other cell architectures can be used such as a charge trapping memory device where charge is stored inside a charge trapping layer, such as a nitride layer or a nano-crystal layer.

Word-line decoder 102 controls word-lines WL3 to W0 coupled to the gates of a row of memory cells 114 in embodiments of the present invention. Word-line decoder 102 decodes an input address and selects the proper word-line to be asserted during a memory operation. In the illustration in FIG. 1, only four word-lines are shown, however, in preferred embodiments of the present invention, more word-lines, for example between about 128 and about 2048 may be interfaced to the word-line decoder. In alternative embodiments, more or fewer word-lines can be interfaced to the word-line decoder.

Bit-line decoder 106 provides an interface to bit-lines BL3 to BL0. Again, only four bit-lines are shown for simplicity of illustration, but more bit-lines, for example 1024 bit-lines, are used in embodiments of the present invention. Bit-lines BL3 to BL0 provide an interface from the drains of memory array transistors 114 to sense amplifier 112 during read operations, and to programming voltages generated by charge pump 120 during write and erase operations. Because programming voltages exceed the maximum operating voltages for minimum size low-voltage devices, circuit devices exposed to high voltages are implemented with high-voltage devices. These high voltage devices have a thicker gate oxide and longer channel widths and lengths than minimum size low-voltage devices in an embodiment process to withstand the higher electric fields caused by higher voltages and to protect devices from break-down and/or destruction.

In embodiments of the present invention, medium-voltage devices are preferably used if permitted by the voltage range, which needs to be applied to bit-lines during operation of the memory. Such medium-voltage devices can withstand gate voltages up to about 16V, and withstand drain-source voltages up to about 7V. Alternatively, high-voltage devices can be used. These high-voltage devices can withstand gate voltages up to about 16V, and withstand drain-source voltages up to about 17V in embodiments of the present invention. Low-voltage devices, on the other hand, can only withstand drain-source voltages up to about 1.5V before breaking down.

In an embodiment of the present invention, source-side injection (SSI) techniques are used to program memory array transistors 114. One requirement of the S SI technique is that the drain of the memory cell 114 to be written is set to a high programming voltage. This high programming voltage is typically between about 6V and about 7V according to embodiments of the present invention. Alternatively, other voltages outside of this range sufficient to program memory cell array 108 can be used. In embodiments of the present invention, bit-line level shifter 110 couples a high programming voltage to bit-lines BL3 to BL0, or a lower reference voltage, such as ground or a negative voltage, depending on the desired programming state.

When memory cell transistor 114 is being read, however, bit-lines BL3 to BL0 are precharged to the bias point of the sense amplifier and interfaced to sense amplifier 112. Memory cells 114 programmed in one state will not conduct current and the corresponding bit-line will remain in its precharged state. Memory cells 114 programmed in second state will conduct current and the bit-line will be discharged. In order to determine whether the bit-lines have remained charged or have become discharged, sense amplifier 112 determines the state of the bit-lines and outputs the programmed memory state. In alternative embodiments of the present invention, other sensing schemes can be used. For example, the bias at the bit-line to be read can be regulated, while the current required to keep the bias condition is evaluated in order to determine the state of the bit-line.

When memory cell transistors 114 are being erased, an erase voltage of between 6V and 7V is applied to bit-lines BL3 to BL0 in a manner similar to writing memory cell array 108 described hereinabove.

In alternative embodiments of the present invention, other techniques besides SSI can be used to program memory cells 114. For example, Fowler-Nordheim tunneling can be used to program and erase memory cells 114. Fowler-Nordheim tunneling requires a longer programming time than SSI techniques, but requires less programming current for each cell, which makes Fowler-Nordheim tunneling suitable for Flash memory applications where large blocks of memory are programmed in parallel.

In conventional embodiments, separate circuits are typically used to interface memory cell array 108 to read, write, and erase circuitry via bit-lines BL0 to BL3. For example, some conventional embodiments will wire-OR support circuitry to memory 108. Each bit-line, or group of bit-lines, are interfaced to a separate write circuit, read circuit, and erase circuit according to conventional embodiments. Each of these conventional embodiments read, write and erase circuits, typically contain high-voltage or medium-voltage transistors. These circuits are separate in conventional embodiments because of the optimized nature of these devices. For example, the high-voltage and medium-voltage devices are optimized for a leakage current to on-current ratio required by the particular system. The many high-voltage and/or medium-voltage transistors in the support circuitry requires significant silicon area in conventional embodiments. Separate "channels" of read, write and erase functions seen in conventional embodiments require additional control signals to control the additional high-voltage and medium voltage devices. These additional control signals also require silicon area.

According to embodiments of the present invention, functions of the read, write, and erase circuitry that requires high-voltage and medium-voltage devices are combined into one bit-line level shifter circuit 110. Combining as many possible options into one bit-line level shifter circuit 110 reduces the area devoted to support circuitry in embodiments of the present invention. Furthermore, the combination of high-voltage interface circuits into one bit-line level shifter 110 reduces the number of required select signals, which reduces the number of metallization layers and lowers dynamic power consumption. The reduction in dynamic power consumption is achieved because there are less digital signals that require toggling.

Non-volatile memory system 100 also has control logic that generates control signals for the operation of the memory, and charge pump 120 that generates the high voltage required to write and erase the memory in embodiments of the present invention.

Figure 2:
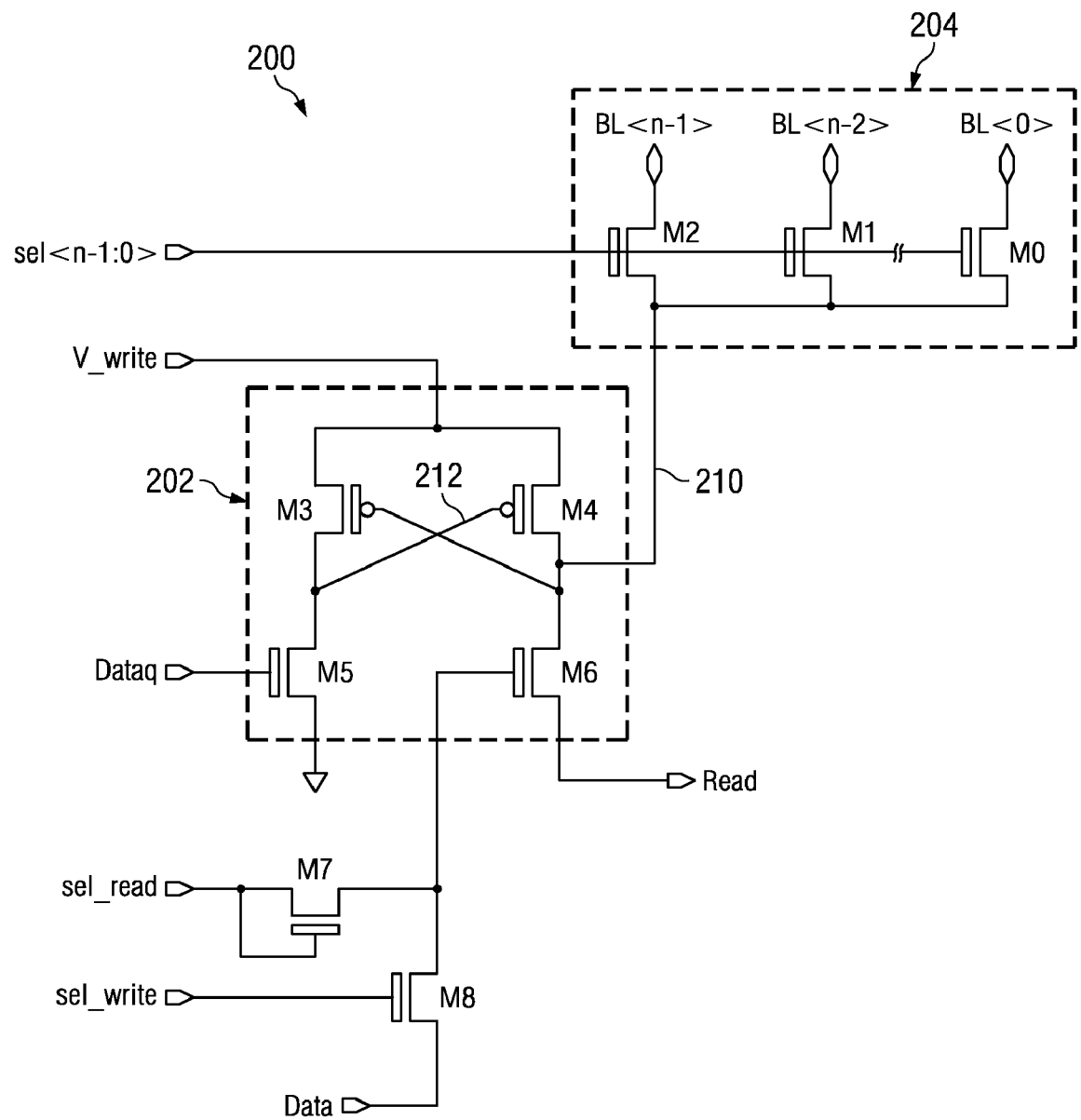
FIG. 2 illustrates a schematic of an embodiment level shifter.

Turning to FIG. 2, a schematic of an embodiment bit-line level shifter 200 is shown. Level shifter 200 has a multiplexer 204 having transistors M0, M1 and M2, a level-shifter core circuit having cross-coupled transistors M3 and M4 and pull-down transistors M5 and M6. Select transistors M7 and M8 are included to select between the read mode and the write mode. Signals sel_read and sel_write preferably select a memory read mode and a memory write mode respectively, and signals Data and Dataq are used to provide data to bit-line level shifter 200 during write operations. Signals Data and Dataq are preferably generated by low-voltage standard logic devices. In embodiments of the present invention, bit-line level shifter 200 receives signals sel_read, sel_write, Data and Dataq, and asserts high-voltage and/or medium voltage levels on bit-lines $BL_{n-1}$ to $BL_0$. Consequently, high-voltage and/or medium-voltage devices are preferably used for all of the devices of the level shifter circuit of FIG. 2.

In embodiments of the present invention, the drains of transistors M0, M1 and M2 in multiplexer 204 are coupled to bit-lines $BL_{n-1}$, $BL_{n-2}$ and $BL_0$. It should be understood that only three transistors M0, M1 and M2 are shown in FIG. 2 for simplicity of illustration, however, in embodiments of the present invention, each of the n bit-lines being served by a particular level shifter will have at least n multiplexer transistors. The number of bit-lines interface to a single level shifter is preferably between 16 and 64; however, a larger or smaller number of bit-lines may be interfaced to a particular level shifter depending on the application. The gates of transistors M0, M1 and M2 are coupled to select lines sel<n-1:0>, which are used to activate one or more of multiplexer transistors M2, M1 and M0. The sources of multiplexer transistors M2, M1 and M0 are coupled to node 210. In preferred embodiments of the present invention, multiplexer transistors M2, M1 and M0 are high-voltage or medium-voltage NMOS transistors. In alternative embodiments of the present invention, other device types can be used including PMOS devices, BJT's or other devices depending on the requirements of the application and the type of semiconductor process used.

Bit-line level shifter 200 also has a level shifter core circuit 202 that includes transistors M3, M4, M5 and M6. Transistors M5 and M6 are preferably high voltage or medium voltage NMOS devices, and transistors M3 and M4 are preferably cross-coupled high-voltage or medium voltage PMOS devices.

In alternative embodiments of the present invention, other circuits may be used in place of level shifter core circuit 202. For example, in some embodiments, cross-coupled transistors M3 and M4 may be PMOS transistors, and transistor M5 and M6 may be NMOS transistors, or all transistors in level shifter core 202 may be of the same transistor type. Furthermore, other known level shifter architectures known in the art may be used in alternative embodiments.

In a preferred embodiment of the present invention, the sources of cross-coupled transistors M3 and M4 are coupled to node V_write, which is set to a voltage of between about 6V and 7V when memory cells 114 (FIG. 1) coupled to selected bit-lines are undergoing a write operation or an erase operation. The source of transistor M6 is coupled to node Read. During write operation, node Read is coupled to a reference voltage, preferably ground, but during read operations, node Read is coupled to a sense amplifier. The gate of transistor M6 is coupled to signal Data through select transistor M8, and the gate of transistor M5 is coupled to signal Dataq, which is an inverted version of signal Data. For example, when signal Data is asserted as logic "High," signal Dataq is asserted as logic "Low." Likewise, when signal Data is asserted as logic "Low," signal Dataq is asserted as logic "High." Logic "High" and logic "Low" states are defined, in this case as according to the thresholds of standard logic devices. For example, in preferred embodiments of the present invention, logic "High" is nominally 1.5V and Logic "Low" is nominally 0V. In alternative embodiments of the present invention, these logic levels may be defined differently depending on the particular application and process.

During a write operation, sel<n-1:0> is used to select a bit-line and connect a bit-line to node 210. Signal sel_write is set to logic "High" turning on transistor M8 and coupling signal Data to the gate of M6 in preferred embodiments. Signal sel_read is set to ground shutting off diode connected NMOS transistor M7, and node Read is grounded in preferred embodiments. If node Data is "High" and node Dataq is "Low," transistor M5 turns off and M6 turns on discharging node 210 to ground. Consequently, transistor M3 turns on pulling node 212 to voltage V_write. Because node 210 is at ground potential, any selected bit-line will be pulled to ground potential.

If node Data is "Low" and node Dataq is "High," on the other hand, transistor M6 turns off, and transistor M5 turns on discharging node 212 to ground. Consequently, transistor M4 turns on pulling node 210 to voltage V_write. Because node 210 is at V_write potential, any selected bit-line will be pulled to V_write.

In Erase operations, multiplexer select lines sel<n-1:0> are set to connect one bit-line, a plurality of bit-lines, or all bit-lines depending on the application. Node V_write is set to an erase voltage, preferably between 4V and 7V, sel_read is set to ground, sel_write is set to logic "High" coupling signal Data to the gate of M6. Signal Data is set to logic "Low" and signal Dataq is set to logic "High" which pulls node 210 to voltage V_write as discussed hereinabove. Consequently, voltage V_write is applied to the selected bit-line or bit-lines.

During read operations in preferred embodiments of the present invention, sel<n-1:0> is used to select one out of the n bit-lines, and V_write is set to a standby voltage. This standby voltage is preferably the low voltage supply voltage in preferred embodiments, or about 1.5V. In alternative embodiments, V_write can be grounded or even maintained at the write voltage. The purpose of setting V_write to a lower standby voltage is to save power by not operating the charge pumps. Node Read is coupled to a sense amplifier and signal sel_read is set to an auxiliary high or medium voltage in the range of 5 to 10V, which turns on transistor M6, thereby coupling the sense amplifier to the selected bit-line. Signal sel_write is set to logic "Low" (preferably ground), thereby shutting off transistor M8 and effectively disconnecting signal Data from level shifter core 202. Signal Dataq is set to logic "Low" ensuring that transistor M5 remains shut-off. Effectively, transistors M3, M4 and M5 are shut down leaving transistor M6 acting as a pass-gate between node 210 and the sense amplifier. In preferred embodiments of the present invention, node Read sees a higher impedance during read operations than during write or erase operations.

It can be seen that bit-line level-shifter 200 combines the high-voltage operation of write, read, and erase modes. More particularly, transistor M6 performs two separate mode dependent functions. In the write and erase modes, transistor M6 functions as a pull-down transistor as a part of level shifter core 202. In the read mode, on the other hand, transistor M6 functions as a pass transistor coupling the bit-line to a sense amplifier.

It can be seen that by using embodiments of the present invention, such as the embodiment illustrated in FIG. 2, the number of high and medium voltage devices per bit-line can be reduced, thereby increasing the area efficiency of a memory module.

Figure 3:
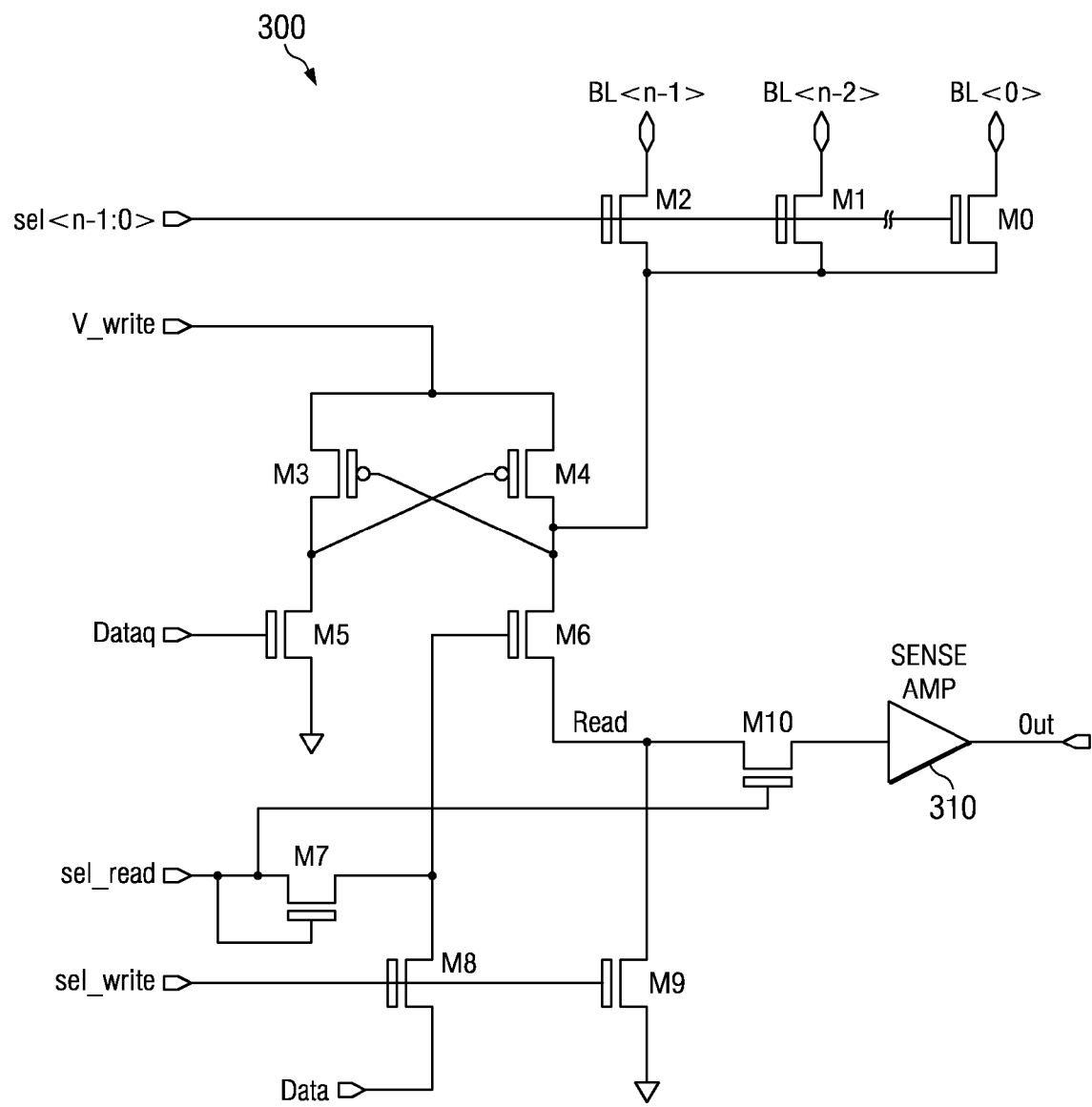
FIG. 3 illustrates a schematic of an alternative embodiment level shifter.

FIG. 3 illustrates an embodiment of the present invention that interfaces a bit-line level shifter 300 with sense amplifier 310. During the read mode when signal sel_read is set to the auxiliary high or medium voltage mentioned above, NMOS pass transistor M10 turns on, thereby coupling node Read to the input of sense amplifier 310. Diode connected NMOS transistor M7 provides a level shift from the auxiliary high or medium voltage to the gate of M10. Signal sel_write is a logic low, preferably ground, shutting off transistor M9. Sense amplifier 310 measures the voltage, current or charge on node Read and determines the stored state of the memory cell coupled to the bit-line. Sense amplifier 310 is designed according to conventional techniques in embodiments of the present invention, however, a variety of architectures can be used.

During write and erase modes, signal sel_read is at logic low, preferably ground, thereby shutting off pass transistor M10, while signal sel_write is maintained at logic "High," thereby turning on transistor M9 and pulling node Read to ground.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacture, compositions of matter, means, methods, or steps.

What is claimed is:

1. A bit-line interface comprising:
   a multiplexer comprising a signal input and a plurality of bit-line outputs;
   a write path coupled to the multiplexer signal input; and
   a read path coupled to the multiplexer signal input, wherein the read path and the write path share at least one component, wherein the at least one component comprises a switch comprising a first terminal coupled to the multiplexer signal input and a second terminal coupled to a variable impedance node, the variable impedance node comprising a first impedance when the bit-line interface is in a read mode, and a second impedance when the bit-line interface is in a write mode, and wherein the first impedance is higher than the second impedance.

2. The bit-line interface of claim 1, further comprising high or medium-voltage devices.

3. The bit-line interface of claim 1, wherein
   the switch can assume an on state or an off state;
   during the read mode, the switch assumes the on state; and
   during the write mode, the switch assumes a state dependent on input data.

4. The bit-line interface of claim 1, wherein the switch further comprises a control node, the control node configured to control a state of the switch.

5. A semiconductor memory comprising:
   a memory cell array;
   a plurality of bit-lines coupled to the memory cell array;
   a multiplexer coupled to the bit-lines; and
   a level-shifter coupled to an input to the multiplexer, the level shifter comprising a write path and a read path, wherein the write path and the read path share at least one common circuit component, and wherein the level shifter comprises
      a first transistor comprising
         a source coupled to a write voltage node, and
         a drain coupled to the multiplexer input,
      a second transistor comprising
         a source coupled to the write voltage node,
         a drain coupled to a gate of the first transistor, and
         a gate coupled to the drain of the first transistor,
      a third transistor comprising
         a drain coupled to the drain of the second transistor,
         a source coupled to a reference voltage, and
         a gate coupled to a first data line, and
      a fourth transistor comprising
         a drain coupled to the multiplexer input,
         a source coupled to a read node, and
         a gate coupled to an intermediate data node.

6. The semiconductor memory of claim 5, wherein the level-shifter comprises:
   a circuit configured to
      couple a write voltage to the multiplexer input while the memory is in a write state, and
      couple the bit-line to a sense amplifier when the memory is in a read state.

7. The semiconductor memory of claim 5, further comprising:
   a fifth transistor comprising
      a source coupled to a gate of the fourth transistor, and
      a gate and a drain coupled to a read select signal; and
   a sixth transistor comprising
      a drain coupled to the gate of the fourth transistor,
      a source coupled to a second data line, and
      a gate coupled to a write select signal.

8. The semiconductor memory of claim 7, wherein
   the write select signal is configured to turn-on the sixth transistor when the memory is in a write mode;
   the read select signal is configured to turn-on the fifth transistor when the memory is in a read mode; and
   the read node is configured to be coupled to the reference voltage though a first impedance when the memory is in the write mode and to a sense amplifier input comprising a second impedance when the memory is in the read mode, wherein the first impedance is less than the second impedance.

9. The semiconductor memory of claim 8, wherein the second data line comprises an inversion of the first data line.

10. The semiconductor memory of claim 8, wherein the first, second, third, fourth, fifth and sixth transistors comprise high-voltage devices.

11. The semiconductor memory of claim 5, wherein the multiplexer comprises a plurality of high-voltage transistors.

12. The semiconductor memory of claim 5, wherein the first, second, third and fourth transistors comprise CMOS transistors.

13. The semiconductor memory of claim 8, wherein the first, second, third, fourth, fifth and sixth transistors comprise high-voltage devices.

14. The semiconductor memory of claim 5, wherein the multiplexer comprises a plurality of high-voltage transistors.

15. The semiconductor memory of claim 5, wherein the first, second, third and fourth transistors comprise CMOS transistors.

16. A bit-line interface comprising:
   a multiplexer comprising a signal input and a plurality of bit-line outputs;
   a write path to the multiplexer signal input; and
   a read path coupled between a sense amplifier and the multiplexer signal input, wherein the read path and the write path share at least one component, wherein the least one component comprises a transistor.

17. The bit-line interface of claim 16, wherein the transistor comprises:
   a control node coupled to a write select signal;
   a first output node coupled to the signal input of the multiplexer; and
   a second output node coupled to the sense amplifier.

18. The bit-line interface of claim 17, wherein:
   the transistor comprises a MOS device;
   the control node comprises a gate of the MOS device;
   the first output node comprises a first source/drain of the MOS device; and
   the second output node comprises a second source/drain of the MOS device.

* * * * *